United States Patent [19]
Baker

[11] Patent Number: 5,199,109
[45] Date of Patent: Mar. 30, 1993

[54] MULTI CHANNEL SCANNING RECEIVER WITH IMPROVED SIGNAL STRENGTH DETECTING CIRCUITRY

[75] Inventor: William Baker, Indianapolis, Ind.
[73] Assignee: Uniden, Ft. Worth, Tex.
[21] Appl. No.: 426,768
[22] Filed: Oct. 26, 1989
[51] Int. Cl.$^5$ ............................................. H04B 1/16
[52] U.S. Cl. ..................... 455/161.2; 455/161.3; 455/165.1; 455/168.1; 455/222
[58] Field of Search ........................ 455/161, 164–166, 455/168, 182–184, 198, 212, 214, 222, 226, 179, 180, 33, 62, 63, 67, 135, 184, 296, 200

[56] References Cited
U.S. PATENT DOCUMENTS

| | | | |
|---|---|---|---|
| 4,430,753 | 2/1984 | Shiratani | 455/52 |
| 4,521,915 | 6/1985 | Baker et al. | 455/165 |
| 4,731,868 | 3/1988 | Dreier | 455/161 |
| 4,742,568 | 5/1988 | Furuya | 455/277 |
| 4,876,743 | 10/1989 | Lindenmeier et al. | 455/133 |
| 4,947,456 | 8/1990 | Atkinson et al. | 455/165 |
| 4,989,263 | 1/1991 | Suzuki | 455/182 |
| 5,027,431 | 6/1991 | Tanaka et al. | 455/214 |
| 5,077,834 | 12/1991 | Andros et al. | 455/193 |

Primary Examiner—Reinhard J. Eisenzopf
Assistant Examiner—Chi H. Pham
Attorney, Agent, or Firm—Michael, Best & Friedrich

[57] ABSTRACT

A scanning radio is provided having a plurality of the following elements: 1. a circuit to develop an output representative of the noise power contained in a demodulated signal at a present time; 2. a circuit to delay the output of (1) thereby generating an output representative of the noise power contained in the demodulated signal at a past time; 3. a comparison circuit to compare the output of (2) with the output of (1) to develop an output indicating decreasing noise power and therefore improving signal quality; 4. a comparison circuit to compare the output of (2) with the output of (1) to develop an output indicating increasing noise power and therefore degrading signal quality; 5. a comparison circuit to compare the output of (1) with a reference level to develop an output indicating noise power above/below a threshold and therefore signal strength below/above a corresponding threshold; 6. control processor responsive to outputs (3), (4), and (5) to control local oscillator generator; 7. control processor responsive to outputs (3) and (4) to control local oscillator generator.

13 Claims, 6 Drawing Sheets

MULTI CHANNEL SCANNING RECEIVER WITH IMPROVED SIGNAL STRENGTH DETECTING CIRCUITRY

BACKGROUND OF THE INVENTION

1. Field of the Invention

This invention relates to scanning radio receivers and, more particularly, to scanning radio receivers particularly useful on the frequencies assigned to the Public Safety Radio Services as well as other frequencies.

2. Description of the Prior Art

Scanning radio receivers are well known in the prior art and have found particular utility for the reception of radio signals on the frequencies assigned by the United States Federal Communications Commission to the Public Safety Radio Services. In the past, many such radio receivers used crystals as the tuning element to provide the necessary local oscillator signals and required the presence of one crystal for each frequency the receiver was capable of tuning. Examples of such receivers are those shown in U.S. Pat. No. 3,531,724 to G. H. Fathauer, U.S. Pat. No. 3,665318 to S. J. Hoffman, et al., U.S. Pat. No. 3,714,585 to R. C. Koch, U.S. Pat. No. 3,725,788 to G. H. Fathauer, U.S. Pat. No. 3,794,925 to K. Imazeki, U.S. Pat. No. 3,801,914 to K. Imazeki, U.S. Pat. No. 3,821,651 to G. H. Fathauer, et al., U.S. Pat. No. 3,873,924 to G. H. Fathauer, U.S. Pat. No. 3,883,808 to J. E. Boone, U.S. Pat. No. 3,824,475 to P. W. Pflasterer, and U.S. Pat. No. 3,987,400 to G. H. Fathauer. There has also been provided by the prior art scanning radio receivers using frequency synthesizing techniques wherein the frequency synthesizing circuitry was controlled by the operation of a processing means such as a microprocessor. Exemplary radio receivers of this type are disclosed in U.S. Pat. Nos. 3,962,644 and 4,092,594, both to W. Baker.

Scanning radio receivers making use of microprocessors to control the frequency synthesizing circuitry have many advantages over the scanning radio receivers known prior thereto. One of the foremost of these advantages is the very high degree of flexibility in control which may be included in such a radio. An example is the "search" mode of operation shown in the aforementioned U.S. Pat. Nos. 3,962,644 and 4,092,594 by which the radio may be successively and automatically tuned to adjacent ones of the Public Safety Radio Service frequencies until the receiver arrives at a frequency upon which a signal is received. Such operation was impractical with scanning radio receivers known prior thereto.

The search mode of operation described above, while being a very advantageous feature, has certain disadvantages and problems which had not been recognized and attacked and, as a result, improved systems have been developed. In particular, systems which embody certain improvements are disclosed in U.S. Pat. Nos. 4,270,217, and 4,409,688, of which the applicant is inventor and U.S. Pat. No. 4,521,915 of which the applicant is co-inventor. As disclosed in U.S. Pat. No. 4,409,688, circuitry is provided for reducing the time required to shift from one frequency to another in a searching or scanning operation. The features to which the claims of the aforesaid application are directed are thus highly advantageous to a receiver incorporating a search mode but they did not address certain other problems associated with rapid frequency scanning.

In particular, the time to search or scan any particular frequency in a receiver using a phase-locked-loop frequency synthesizer circuit was at least as long as the sum of three time periods: the time required for the controller or microprocessor to generate the control signals necessary to tune the receiver to the new frequency, the "settling time" for the phase-locked-loop to adjust itself and bring the local oscillator signal to the desired frequency, and the time needed for the receiver circuitry to reliably detect the presence or absence of a received signal above a minimum signal level at the new frequency. Any steps taken to reduce any of these three time periods can be of importance in materially shortening the time required to search a large number of frequencies. The reduction occurs each time a new frequency is tuned so that the shortening of the time required to search a number of frequencies is equal to the reduction in the time period required for any individual frequency multiplied by the number of frequencies searched. In a receiver constructed in accordance with U.S. Pat. No. 4,409,688, a reduction in the time required to scan a particular frequency is achieved by overlapping the generation of the synthesizer control signals for the next frequency to be scanned with the phase-locked-loop settling time and the time required to detect the presence or absence of a received signal. The processor outputs a frequency code from a register and simultaneously synchronizes a timer and initiates the processing of data to supply a new code to the register. At the end of the time interval established by the timer, an interrupt signal is developed and if no indication is developed on a "signal present" line of the receiver the new code is immediately output to the synthesizer.

Any such additional reduction in time can be particularly advantageous in receivers such as the aforementioned which have the capability of searching all frequencies assigned to a particular service since in some cases, the number of frequencies assigned to a single service may be large. However, in shortening the time required to tune a receiver to a new frequency during the search or scan modes, it must be recognized that in some cases the user will use the receiver in a manual mode wherein he will either cause it to become tuned to either one of a plurality of preselected frequencies or to a frequency being newly specified by the user. Increasing the search or scan speeds should not be at the expense of eliminating the capability for operation of the receiver in the manual mode. Moreover, some scanning radio receivers include a priority operation wherein one receiver channel is assigned a priority status and the receiver automatically and periodically checks the frequency of that channel for the presence of a received signal and, if found, places the receiver on that channel. Any effort to shorten the scan or search time should not adversely affect the priority operation.

SUMMARY OF THE INVENTION

Accordingly, the present invention has the general object of further improving upon scanning radio receivers, particularly with regard to making it possible for a user to obtain automatic scanning of many different bands or groups of frequencies.

Another object of the invention is to obtain such improvements without unduly increasing the complexity and expense of manufacture of a receiver and while obtaining highly reliable operation.

A further object of the invention is to provide means of reducing the time required to shift from one frequency to another in a searching or scanning operation.

In a receiver constructed in accordance with the invention, a digitally controlled frequency synthesizer is provided for generating a local oscillator signal for mixing with a received signal to produce an intermediate frequency signal which is applied to a detector circuit to develop an audio output signal. The audio output signal is applied to squelch signal circuits, otherwise known as signal processing circuits, to further develop signals indicative of increasing audio noise power, decreasing audio noise power and audio noise power below a predetermined threshold level. The signals so developed are applied to a processor such that the processor can discern an increasing or decreasing trend in the received signal strength and thereby more rapidly ascertain the presence or absence of a received signal on the channel to which the receiver is tuned.

Thus in its simplest form the receiver of the present invention includes a plurality of the following elements: 1. a circuit to develop an output representative of the noise power contained in a demodulated signal at a present time; 2. a circuit to delay the output of (1) thereby generating an output representative of the noise power contained in the demodulated signal at a past time; 3. a comparison circuit to compare the output of (2) with the output of (1) to develop an output indicating decreasing noise power and therefore improving signal quality; 4. a comparison circuit to compare the output of (2) with the output of (1) to develop an output indicating increasing noise power and therefore degrading signal quality; 5. a comparison circuit to compare the output of (1) with a reference level to develop an output indicating noise power above/below a threshold and therefore signal strength below/above a corresponding threshold; 6. control processing means responsive to outputs (3), (4), and (5) to control local oscillator generating means; 7. control processing means responsive to outputs (3) and (4) to control local oscillator generating means.

With this arrangement, the time required to shift from one frequency to another during a scanning or searching operation is substantially reduced and the time required to search through a number of frequencies is correspondingly reduced.

The receiver of the invention is preferably arranged to scan a number of groups of frequencies such as those assigned to particular services and the reduction in the scanning time is especially advantageous in such a receiver since a large number of frequencies may be included in one of such groups.

This invention contemplates other objects, features and advantages which will become more fully apparent from the following description taken in conjunction with the accompanying drawings.

DESCRIPTION OF THE PREFERRED EMBODIMENT

Figure 1:
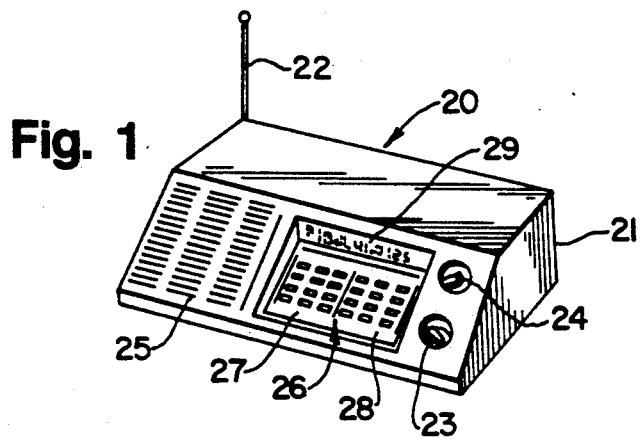
FIG. 1 is a perspective view of a scanning radio receiver constructed in accordance with the invention.

As shown in FIG. 1, a scanning receiver 20 constructed in accordance with the principles of this invention. The receiver 20 may include a cabinet 21 having a telescopic antenna 22 projecting therefrom, having volume and squelch control knobs 23 and 24 on a front inclined face 20a thereof, and having a grill portion 25 behind which a speaker 25a is mounted.

The operation of the receiver 20 is controlled from a keyboard 26 which includes a left-hand program section 27 including numeric keys 27a for entering in frequencies to be received and a right-hand operation section 28 including keys 28a for effecting manual and various automatic control functions. In addition, the receiver 20 includes a display 29 for indicating the frequency to which the 20 receiver is tuned and for indicating the status of various channels and control functions of the receiver.

In typical operation, the receiver 20 may be tuned to a certain frequency as indicated by the display 29. In a manual mode of operation, or when a "hold" feature is selected, the receiver will remain tuned to that frequency indefinitely. The receiver will also perform an automatic scanning operation in which it senses the termination of a signal and then automatically tunes itself to a new frequency. If no signal is sensed at the new frequency within a certain time interval, the receiver then automatically tunes to a another new frequency, continuing until a frequency is found at which a signal is received.

Figure 2:
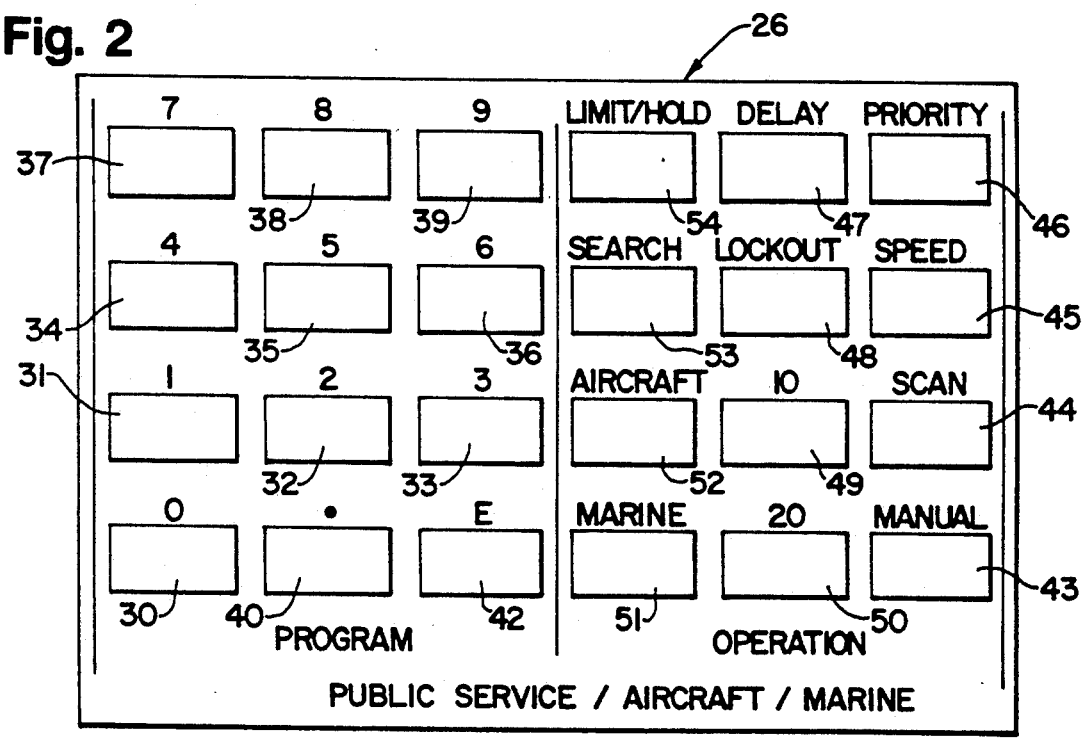
FIG. 2 is a plan view of a keyboard of the radio of FIG. 1.

The frequencies to which the receiver tunes itself are controllable by entering selected frequencies into a memory, using the program section 27 of the keyboard 26, or the receiver may scan through frequencies designated by the Federal Communications Commission for marine or aircraft use. FIG. 2 shows the arrangement of the keyboard 26 in which the program section 27 includes 10 numeric keys respectively designated by reference numerals 30–39 and operative for signaling the digits 0 through 9. The program section 27 further includes a decimal key 40 and a key 42 labeled "E" and operative for effective entry of the frequency selected through the use of the numeric keys 30–39 and decimal point key 40.

The operation section 28 includes twelve keys for obtaining various operations. A "MANUAL" key 43 is operable for stopping a scanning or searching operation and for stepping the receiver through all of its channels, the illustrated receiver having twenty channels. A "SCAN" key 44 is usable for initiating the scanning of all channels. A SPEED key 45 is operable for selecting between slow and fast scan or search rates.

A "PRIORITY" key 46 is operable to cause the receiver to switch to one channel such as Channel 1 periodically, for example, every two seconds, regardless of any other signals. A "DELAY" key 47 is usable to interpose a predetermined delay between the end of of a transmission on one channel and the initiation of of a scan or search for a new frequency, this key being usable primarily for allowing monitoring of two-way conversations. A "LOCKOUT" key 48 is operable for locking out one or more channels during a scanning operation. Keys 49 and 50, respectively labeled as "10" and "20" keys, are provided for control of the inclusion or exclusion of either of two banks of ten channels each in the scanning operation.

A "MARINE" key 51 is provided for effecting the automatic scanning of signals in a band designated by the Federal Communications Commission for marine use and an "AIRCRAFT" key 52 ia provided for effecting an automatic scanning of frequencies designated by the Federal Communications Commission for aircraft use.

A "SEARCH" key 53 is provided for initiating a searching between certain frequencies which may be preselected through the use of the keyboard section 27 and a "LIMIT-HOLD" key 54. In addition to being usable to enter the search frequency limits, the key 54 is usable to hold the frequency of tuning at a frequency to which the receiver is tuned when the key 54 is depressed.

Figure 3:
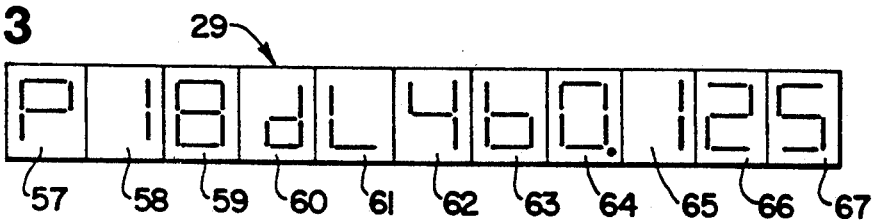
FIG. 3 is plan view of a display of the receiver of FIG. 1, illustrating indications obtained during certain conditions of operation.

The display 29 includes eleven spaces or "windows" indicated by reference numerals 57–67. The first five spaces 57–61 are used for indicating the status of priority and other controls as well as the number of the channel being received, while the last six spaces 62–67 indicate the frequency to which the receiver is tuned. In the condition of the display 29 as illustrated in FIG. 3, the receiver is operated on channel 18 as indicated in the second and third windows 58 and 59, the channel has priority status as indicated by letter "P" in window 57, a delay operation is in effect as to the selected frequency as indicated by the letter "d" in window 60 and the lockout function is effective as to the selected channel as indicated by the letter "L" in the window 61.

The receiver 20 has circuitry such that it accurately tunes itself to any one of a very large number of frequencies and rapidly scans groups of frequencies selected by the user, responding only to signals of possible interest to the user. With respect to the frequencies covered, the receiver may cover the "low" and "high" VHF bands and the UHF band which are designated for public service use by the Federal Communications Commission, respectively extending from 30–50 Mhz, 148-174 Mhz, and 450–470 Mhz. The Maritime band from 156.275 Mhz to 162.000 Mhz controlled by the "MARINE" key 51 is included within the "high" VHF band. In addition, the receiver covers a band designated for aircraft use, extending from 118 to 136 Mhz, and a band from 144–148 Mhz which includes the 2-meter Amateur band.

The receiver also covers UHF frequencies from 420.5 Mhz to 450 Mhz including an Amateur band from 440.050 Mhz to 444.950 Mhz and UHF frequencies from 470 to 512 Mhz designated as television or "T" band. For convenience, "L" is used herein to designate the frequency range or band from 30 to 50 Mhz, "A" designates an aircraft band from 118 to 136 Mhz, "H" designates a VHF band from 144 to 174 Mhz and "UHF" designates a band from 420.5 to 512 Mhz. Specific features of the receiver relate to arrangements such that the FCC requirements with respect to modes of modulation and frequency spacings between adjacent channels are taken into account, to obtain efficient and reliable reception while minimizing the complexity of the receiver.

Figure 4:
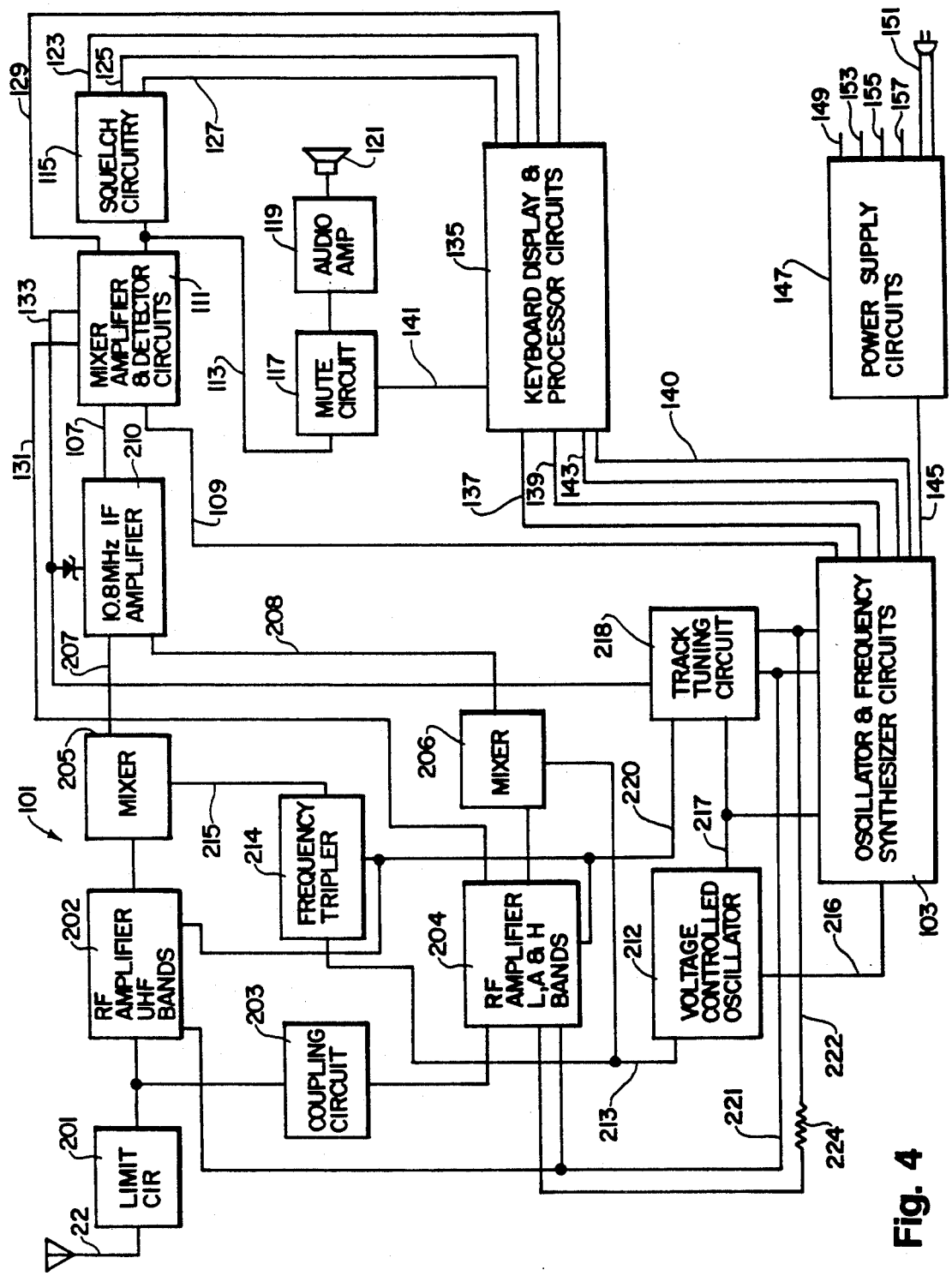
FIG. 4 is a schematic block diagram of a scanning receiver incorporating the present invention.

FIG. 4 is a schematic block diagram of the circuitry of the receiver 20. A receiver 20 has three principal portions. The first is an RF portion generally indicated by reference numeral 101 which is controlled from oscillator and frequency synthesizer circuits 103 to develop from any signal on the antenna 22 which is a selected frequency channel, a 10.8 Mhz IF signal on line 107. Also, a 10.4 Mhz reference signal is developed on an output line 109 from the oscillator and frequency synthesizer circuits 103.

The second principal portion of the receiver includes mixer, amplifier, and detector circuits 111 which respond to the 10.8 Mhz IF signal on line 107 and the 10.4 Mhz reference signal on line 109, used as a second local oscillator signal, to develop an audio output signal applied through line 113 to squelch circuitry 115 and to mute circuit 117. The audio output signal passes through mute circuit 117 and audio amplifier circuit 119 to a speaker 121. The squelch circuitry 115 develops a control signal on line 123 for signaling the presence of a received signal above a certain signal strength. The squelch circuitry 115 also develops a control signal on line 125 for signaling the presence of a received signal that has signal strength that is increasing with time and a control signal on line 127 for signaling the presence of a received signal that has signal strength that is decreasing with time. The mixer, amplifier, and detector circuits 111 include demodulators for both FM and AM reception and an A-band control signal is applied thereto through a line 129 to condition the circuits for AM reception which is required in the "A" or aircraft band from 118 to 136 Mhz.

Additional functions of the circuits 111 include generation of an AGC or automatic gain control signal on a line 131 and a signal on line 133 for control of tuning in the RF portion 101 of the receiver.

The third principal portion of the receiver 20 is a control portion and includes keyboard, display, and processor circuits 135. To control the frequency of tuning of the RF portion, such circuits operate to supply data signals which are applied through a line 137 to the oscillator and frequency synthesizer circuits 103 along with clock signals applied through a line 139. A line 140 is provided for a signal from the oscillator and synthesizer circuits 103 to indicate to the keyboard, display, and processor circuits 135 an on-channel condition of the phase locked loop circuitry contained within the oscillator and frequency synthesizer circuits 103. In addition, the circuits 135 develop a mute signal on a line 141, applied to mute circuit 117 to silence the receiver during certain conditions of operation such as during switching from one channel to another. The circuits also develop the "A" band control signal on line 129. Circuits 135, of course, respond to the signals applied from operation of the various keys of the keyboard and, during a scanning operation, the circuits 135 respond to the control of signals developed by squelch circuitry 115 applied through lines 123, 125, and 127. It is noted that a master clock signal at a frequency of 433 Khz may be applied from circuits 103 and through line 143 to the circuits 135 for possible usage for clock purposes.

Another 433 Khz signal may be applied from the circuits 103 and through a line 145 to a power supply circuit 147 in which the signal is divided down to a 25 Khz signal which is amplified and rectified to produce a 25 volt supply voltage on a line 149. The circuit 147 may be connected to a battery supply and/or a line cord 151 and develops various other DC supply voltages such as 5 volts, 8 volts, and 11.4 volts on lines 153–157, respectively.

With respect to the RF portion 101, signals from the antenna 22 are applied to the input of a limit circuit 201 which may include diodes operative to prevent overload of the receiver from extremely strong signals and which may also include an inductor for attenuating frequencies below the H-band and to also provide an improved impedance match. The output of the limit circuit 201 is applied directly to the input of an RF amplifier circuit 202 for the UHF band (420–512 Mhz) and through a coupling circuit 203 to the input of another RF amplifier 204 for the L, A, and H bands (30–50, 118–136, and 144–174 Mhz). The outputs of the RF amplifiers 202 and 204 are applied to inputs of UHF band and L, A, and H band mixer circuits 205 and 206 which have outputs connected through lines 207 and 208 to inputs of a 10.8 Mhz IF amplifier 210 connected to the line 107.

To develop a 10.8 Mhz signal on the output line 207, the UHF band mixer circuit 205 is supplied with a signal which has a frequency 10.8 Mhz lower than that of the signal to be received, the signal being thus variable in frequency over a range from 409.7 Mhz to 501.2 Mhz. To develop the signal for application to the mixer circuits 205, a voltage controlled oscillator 212 is operated in a lower frequency range and its output is connected through a line 213 to the input of a frequency tripler 214, the output of the frequency tripler 214 being applied through line 215 to the mixer circuit 205. Thus, to develop the local oscillator signal for reception in the 420.5–512 Mhz UHF band, the voltage controlled oscillator 212 may be operated in a frequency range from 136.567 to 167.067 Mhz.

The L, A, and H band mixer circuit 206 is directly connected to the output line 213 of the voltage controlled oscillator. For operation in the L band from 30 to 50 Mhz and also for operation in the A-band from 118 to 136 Mhz, the oscillator frequency is preferably above the desired signal frequency while for operation in the H band from 144 to 174 Mhz, the oscillator frequency is below the desired signal frequency. Thus, for operation in the L, A, and H bands, the voltage controlled oscillator 212 may supply signals in the ranges from 40.8 to 60.8 Mhz, 128.8 to 146.8 Mhz and 133.2 to 163.2 Mhz.

For control of the frequency of operation, the voltage controlled oscillator 212 has a second output which 212a supplies a signal at its operating frequency through a line 216 to the oscillator and frequency synthesizer circuits 103. Circuits 103 respond to the signal so applied to develop a DC output signal on a line 217 which is applied to the oscillator 212 to maintain the output frequency of the oscillator at a certain value determined by the input data supplied to circuits 103 through line 137 from the keyboard, display, and processor circuits 135.

The DC output signal on line 217 is also applied to a track-tuning circuit 218 which develops a corresponding DC control voltage on a line 220 which is connected to the RF amplifiers 202 and 204 and also to the frequency tripler 214, to control the tuning of tuned circuits therein, voltage-controlled capacitors being preferably provided in the circuits 202, 204, and 214 for this purpose.

The track tuning circuit 218 is controlled from the A-band control signal on line 133 and is additionally controlled from control signals applied through lines 221 and 222 from the circuits 103 in accordance with input data supplied through line 137 from the keyboard, display, and processor circuits 135. The signals on lines 221 and 222 are referred to herein as UHF and OSC signals, respectively. The UHF signal is developed during operation in the UHF band and the OSC signal is developed during operation in the A, H, and UHF bands. Thus, the track tuning circuit 218 responds to the variable DC control signal on line 217 and to the A-band, UHF and OSC control signals on lines 133, 221, and 222 to develop the DC control voltage on line 220 which is appropriate for control of the circuits 202, 204, and 214 according to the existent conditions of operation. The UHF control signal on line 221 is also applied to the RF amplifiers 202 and 204 and operates to disable the UHF amplifier 202 during L, A, and H band operation and to disable the L, A, and H band amplifier 204 during UHF operation.

Figure 5:
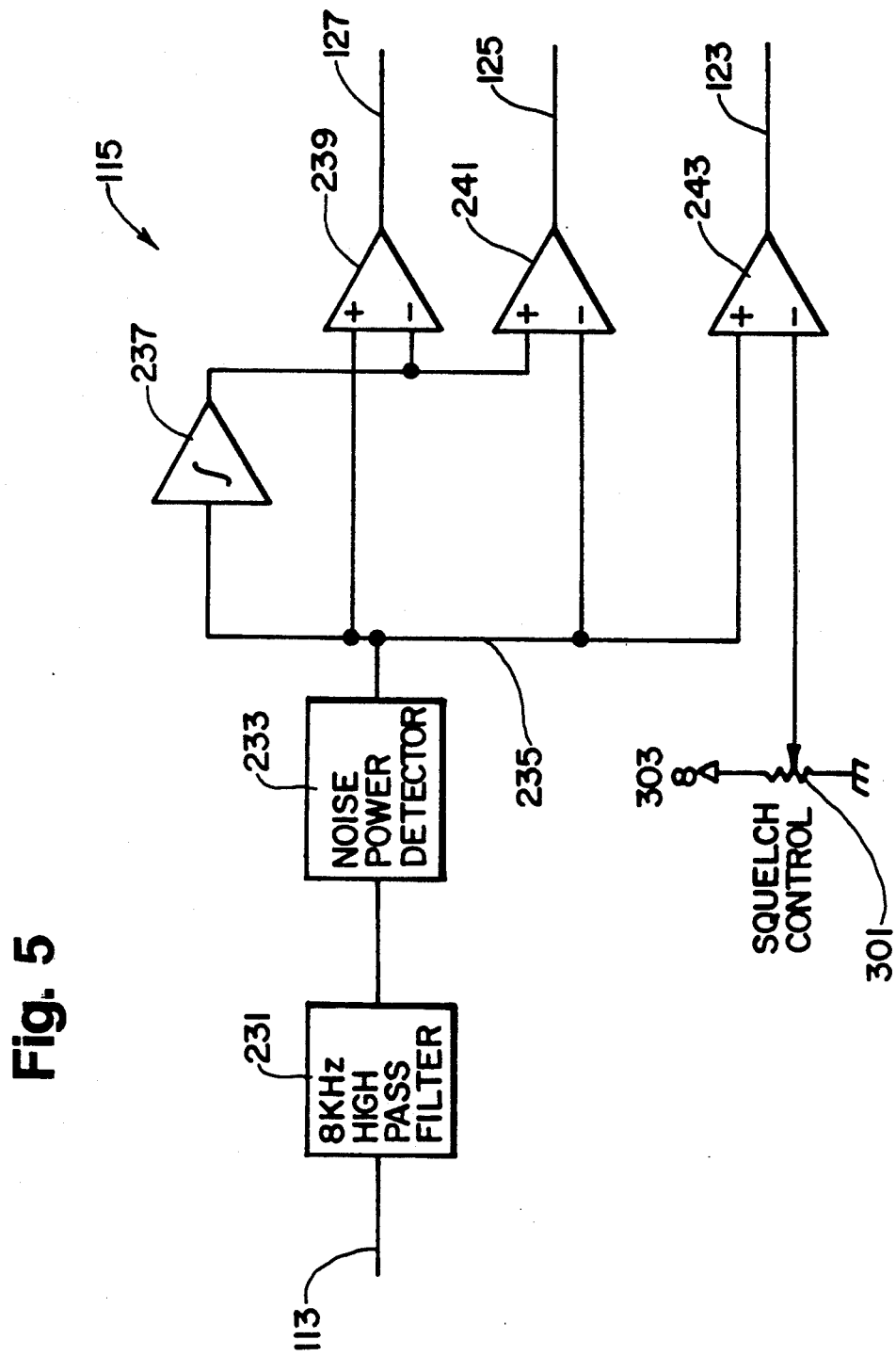
FIG. 5 is a schematic block diagram of the preferred embodiment of the squelch signal circuitry of the present invention.

The OSC control signal on line 222 is also applied through a resistor 224 to the L, A, and H band amplifier 204 and it operates to short out an inductor of the amplifier 204 to change its timing during operation in the A and H bands. 222222 FIG. 5 is a schematic block diagram of the squelch circuitry 115. The audio output signal developed by the mixer, amplifier, and detector circuits 111 is applied to high pass filter 231 via line 113. The high pass filter 231 is coupled to noise power detector 233 to develop on line 235 a voltage analog of the noise power contained in the audio output signal present on line 113. The characteristics of high pass filter 233 are such that voice and data frequencies below 8 Khz are effectively removed from the audio output signal before presentation to noise power detector 233.

The noise power voltage on line 235 is applied to integrator 237, the non-inverting input of voltage comparator 239, and the inverting input of voltage comparator 241, and the non-inverting input of voltage comparator 243. The output of integrator 237 is connected to the inverting input of voltage comparator 239 and to the non-inverting input of voltage comparator 241. The inverting input of voltage comparator 243 is connected to the arm of potentiometer 301. One end of potentiometer 301 is connected to an +8 v supply terminal 303. The remaining terminal of potentiometer 301 is connected to ground.

Integrator 237 functions to produce a time-delayed noise power voltage at its output. The amount of delay introduced is of fixed value as determined by the component values used within the integrator 237, but in the preferred embodiment of the invention the delay is fixed at one millisecond. Thus, the input of integrator 237 is a voltage analog of the noise power contained in the recovered audio at a present time and the output of integrator 237 is a voltage analog of the noise power contained in the recovered audio at a past time.

The time-delayed noise power voltage is used as a reference voltage at the inverting input of comparator 239 and at the non-inverting input of comparator 241. The remaining inputs of comparators 239 and 241 each receive the undelayed noise power voltage. Thus, comparators 239 and 241 compare noise power at a past time with noise power at a present time to arrive at a determination of the trend of the received signal strength. Comparator 239 produces a logic output on line 127 when noise power is increasing; thus signal strength is decreasing with time. Conversely, comparator 241 produces a logic signal output on line 125 when noise power is decreasing; thus signal strength is increasing with time. Comparator 243 compares the noise power at a present time with a reference voltage present on the arm of the potentiometer 301 and thus produces on line 123 a logic output indicative of noise power below a selected level, received signal strength is therefore above a threshold level. The operation of comparator 243 is equivalent to the traditional squelch circuitry of prior art scanning receivers.

The trend signals developed on lines 125 and 127 are presented to the keyboard, display and processor circuits 135 where the time rate of change of received signal strength may be quickly determined. If, while scanning, signal strength is found to be increasing shortly after outputting new frequency data to oscillator and frequency synthesizer circuits 103 then further frequency changing may be suspended. The squelch signal developed on line 123 is also presented to the keyboard, display, and processor circuits 135 to allow the processor to determine when to activate control line 141 and thus allow the recovered audio signal to pass through the mute circuit 117 to the audio amplifier 119.

Figure 6:
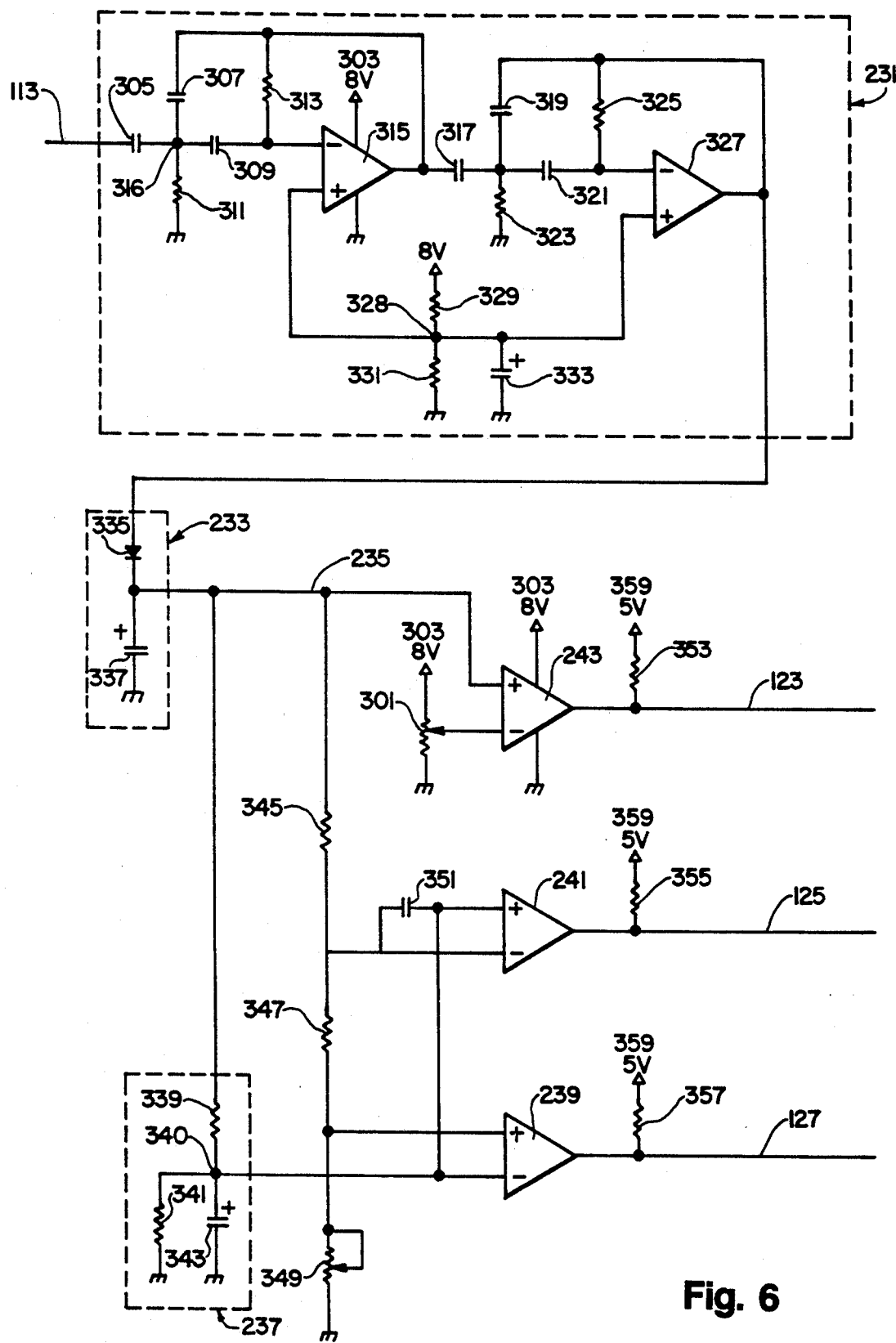
FIG. 6 is a schematic circuit diagram of the preferred embodiment of the squelch signal circuitry of the present invention.

FIG. 6 is a schematic circuit diagram of the squelch circuitry 115. Capacitors 305, 307, and 309 with resistors 311 and 313 and operational amplifier 315 comprise a first section of high pass filter 231. Recovered audio on line 113 is applied to the first filter section through capacitor 305. Capacitors 305, 307, and 309 are connected to a common terminal 316. Capacitor 307 is connected to the output of operational amplifier 315 and resistor 313. Capacitor 309 is connected to the other side of resistor 313 and to the inverting input of operational amplifier 315. A resistor 311 is connected from terminal 316 to ground. An identical second section of high pass filter 231 is connected to the output of operational amplifier 315. Capacitors 317, 319, and 321 with resistors 323 and 325 and operational amplifier 327 comprise the second section of high pass filter 231. Operational amplifiers 315 and 327 in the preferred embodiment are type LM458 manufactured by National Semiconductor Corporation. While high pass filter 231 may be constructed using a single section of filtering, the preferred embodiment utilizes two sections to ensure that there is no contamination of the noise power signals with voice or data information. The non-inverting inputs of operational amplifiers 313 and 327 are connected together and to terminal 328. Resistor 329 is connected from terminal 328 to supply terminal 303. Resistor 331 and capacitor 333 are connected from terminal 328 to ground and form with resistor 329 a bias voltage source for operational amplifiers 315 and 327. The output of the high pass filter 231 is applied to the anode of diode 335. The cathode of diode 335 is connected to line 235. Capacitor 337 connects between line 235 and ground and in combination with diode 335 forms noise power detector 233. The non-inverting input of voltage comparator 243 is connected directly to line 235.

Integrator 237 is formed by resistor 339 connected from line 235 to terminal 340 and by resistor 341 and capacitor 343 connected from terminal 340 to ground. The inverting input and non-inverting input, respectively, of trend comparators 239 and 241 connect to terminal 340.

Resistor 345 is connected from line 235 to the inverting input of trend comparator 241. Resistor 347 is connected from resistor 345 to the noninverting input of trend comparator 239 and a variable resistor 349 connects from resistor 347 to ground. The voltage divider comprised of resistors 345 and 347 and variable resistor 349 determines the signal levels at which the trend comparators sense increasing and decreasing received signal strength. Capacitor 351 provides high frequency compensation to comparators 239 and 241. Comparators 239, 241, and 243 are preferably of type LM339 manufactured by the National Semiconductor Corporation. Resistors 353, 355, and 357 pull the outputs of squelch comparator 243 and trend comparators 239 and 241, respectively, to the 5 volt supply terminal 359.

Figure 7:
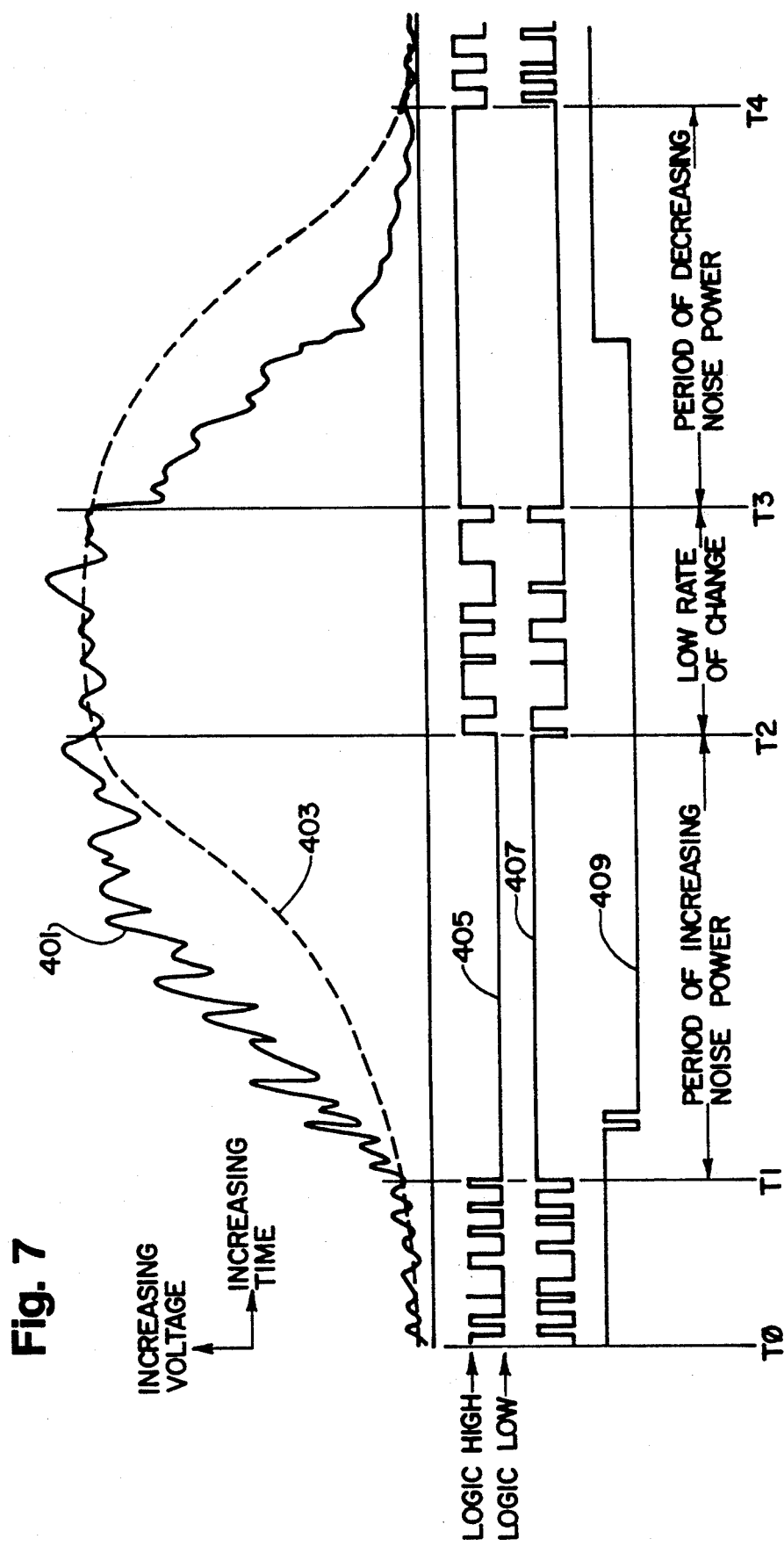
FIG. 7 shows a timing chart for describing operation of the squelch signal circuitry according to the preferred embodiment.

FIG. 7 is a timing chart depicting operation of the squelch circuitry 115. Increasing time is shown on the horizontal axis of FIG. 7. The waveform by reference number 401 represents the noise power voltage at a present time, developed on line 235 of FIG. 5. The waveform denoted by reference number 403 represents the delayed noise power voltage present at the output of integrator 237. Reference numbers 405 and 407 identify the output of trend comparators 239 and 241, respectively. The waveform of reference number 409 is that of the output of squelch comparator 243. During the time interval from T0 to T1 the receiver is tuned to an active channel and thus the outputs of both trend comparators fluctuate randomly, indicating relatively constant signal strength. The output of the squelch comparator is at a 5 volt level, or logic high, and thus the keyboard, display, and processor circuits 135 cause the receiver to be unmuted. At time T1 new frequency data is output to the oscillator and frequency synthesizer circuits 103. The output of trend comparator 239 goes to zero volts, or a logic low level, and the output of trend comparator 241 becomes a logic high to indicate a period of decreasing signal strength as the receiver scans to a new channel. The squelch signal from comparator 243 becomes low to indicate to the keyboard, display, and processor circuits 135 that the receiver is to be muted. From time T2 to T3, the receiver 20 is tuned to an inactive channel. As signal strength is neither increasing nor decreasing the trend comparator outputs again fluctuate randomly. The squelch line 123 remains at a logic low as no signal is present within the tuned channel. At time T3 the keyboard, display and processor circuits 135 outputs new frequency data to the oscillator and synthesizer circuits 103. As the receiver tunes away from the unoccupied channel to a new, active channel, the output of trend comparator 239 goes to a logic high while the output of trend comparator 241 goes to a logic low thus indicating increasing signal strength to the keyboard, display, and processor circuits 135. Note that the squelch line 123 does not become logic high until the signal strength exceeds the level as determined by the setting of potentiometer 301. At time T4 the trend comparator outputs again fluctuate thus indicating relatively constant signal strength.

Figure 8:
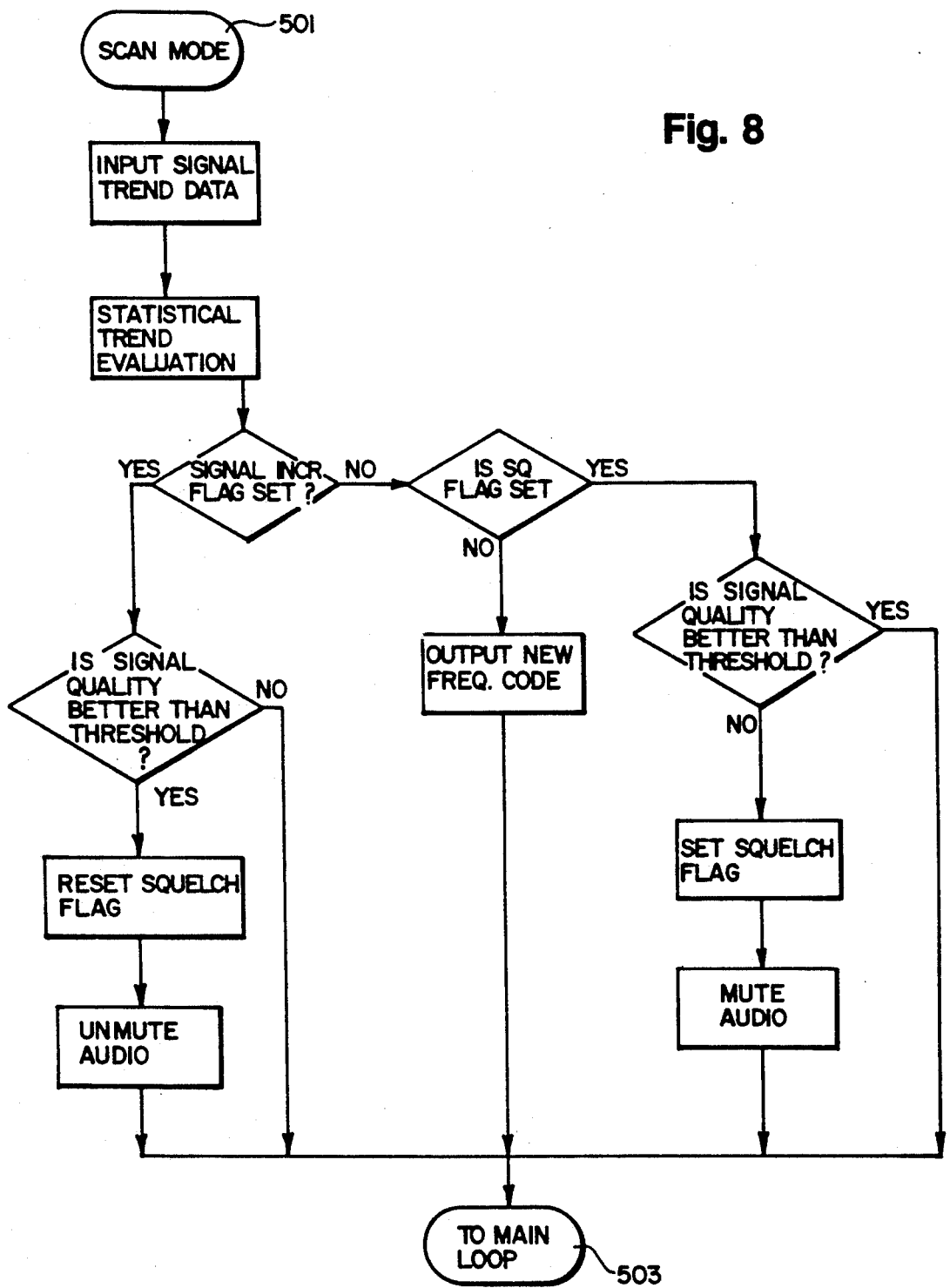
FIG. 8 is a partial flowchart illustrating use of the processor circuitry of the receiver of FIG. 4.

FIG. 8 is a partial software flowchart for use by the keyboard, display, and processor circuits 135 of a receiver 20 constructed according to the preferred embodiment. The keyboard, display, and processor circuits 135 may advantageously utilize the signal strength trend indications present on lines 125 and 127 to reduce the time required to scan each frequency channel during a scanning or searching operation or to rapidly ascertain the presence or absence of a signal on a selected priority channel during priority scanning operations. Reference number 501 identifies the entry point of a subroutine that evaluates the signal trend indicators and controls the oscillator and synthesizer circuits 103 and mute circuit 117 based upon the result of the signal trend evaluation.

The present values of the trend indicators are read and, along with past values, are analyzed by a statistical trend evaluation procedure. The evaluation results in a signal increasing flag being set or reset. If the signal increasing flag is set, the squelch indicator is examined to determine if the signal quality exceeds a threshold as set by the squelch potentiometer 301. If the signal quality is acceptable, a squelch flag is reset and the receiver audio is unmuted. If the signal quality has not reached an acceptable level, the subroutine terminates and control transfers to the main loop at reference number 503.

If, after trend evaluation, the signal increasing flag is reset, the squelch flag is examined to determine if it was previously set. If it was, a new frequency code is written to the oscillator and synthesizer circuits 103 and the subroutine terminates. However, if the squelch flag was previously reset the squelch indicator is examined. If the signal quality has remained acceptable no action is performed and the subroutine terminates. If the signal has degraded, the squelch flag is set and the receiver audio is muted. It will be appreciated by those skilled in the art that although in the system as illustrated and described the signal trend and squelch functions are implemented using a combination of analog circuitry and a microprocessor arrangement, they can be implemented by other forms of apparatus including, but not limited to, digital signal processing means contained entirely within a microcomputer arrangement. It will also be appreciated that as a result of the invention disclosed herein the scanning speed of a receiver 20 is markedly increased.

It will be understood that modifications and variations may be effected without departing from the spirit and scope of the novel concepts of this invention.

I claim as my invention:

1. A signal seeking receiver for automatically scanning and monitoring a plurality of predetermined radio frequency channels located in one or more RF bands, and for selecting one channel having a radio frequency signal thereon, said receiver comprising:

an RF section for said RF bands including a RF amplifier and a RF band mixer, said RF section providing an intermediate signal when a radio frequency signal is received on a channel;

an IF section operably connected to said RF band mixer and including an IF amplifier for amplifying the intermediate signal received from said RF section; detector means for producing an audio signal when said intermediate signal is being received;

an audio amplifier connected to said detector means for driving an audio speaker with said audio signal;

frequency generating means for selectively generating beating signals of predetermined frequencies for application to said RF mixer so as to select a frequency and provide said intermediate signal, said frequency generating means being operable to provide said beating signals in response to various preselected input signals being applied thereto;

signal processing means coupled to said detector means for developing a first signal indicative of audio noise power increasing with time and therefore decreasing received RF signal strength, a second signal indicative of audio noise power decreasing with time and therefore increasing received RF signal strength, and a third signal indicative of audio noise power below a certain threshold and therefore received RF signal strength above a corresponding RF signal strength threshold, said signal processing means comprising;

first circuit means for developing on an output thereof an voltage analog of the noise power contained in said audio signal from said detector means, said output representing the noise power contained in said audio signal at a present time;

second circuit means connected to said first circuit means for developing on an output thereof a delayed voltage analog of the noise power contained in said audio signal from said detector means, said output representing the noise power contained in said audio signal at a past time;

first comparison means for comparing the output of said first circuit means with the output of the second circuit means so as to develop on an output thereof a signal indicative of an increasing trend in the received RF signal strength;

second comparison means for comparing the output of said first circuit means with the output of said second circuit means to develop on a output thereof a signal indicative of a decreasing trend in the received RF signal strength;

third comparison means for comparing the output of said first circuit means with a reference level so as to develop on an output thereof a signal indicative of an RF signal strength that exceeds a level corresponding to the said reference level; and control processing means responsive to said outputs of said signal processing means for controlling said frequency generating means, said control processing means including means for determining the trend over time of the received RF signal strength and operative to modify said various preselected input signals to said frequency generating means in response to said trend determination.

2. A receiver as defined in claim 1, and further including means for muting said audio amplifier wherein said muting means is controlled by an additional signal derived from said control processing means, said control processing means being responsive to the output of said third comparison means of said signal processing means.

3. A receiver as defined in claim 1, wherein said frequency generating means includes frequency synthesizing means incorporating a phase locked loop and being operable to provide said beating signals of preselected frequencies in response to various preselected input signals being applied thereto.

4. A receiver as defined in claim 2, wherein said control processing means comprises a microprocessor and display means for providing visual readout of selected information concerning the operation of said receiver and keyboard means for entering and loading instructions and frequency information for controlling the operation of said receiver.

5. A receiver as defined in claim 1, wherein said second circuit means of said signal processing means is an integrator.

6. A receiver as defined in claim 1, wherein said signal processing means includes a user adjusted squelch potentiometer for developing a reference voltage.

7. A receiver as defined in claim 3, wherein said control processor means includes means for responding to an on-channel indication from said frequency generating means.

8. A radio receiver for receiving radio broadcast signals over a plurality of channels, said radio receiver comprising:

means for sensing the presence or absence of a signal on a radio channel;

means, including an integrator, for determining the trend over time of the signal strength of a radio channel, said integrator holding the past signal strengths of the radio channel;

means for sending a signal from said sensing means to said means for determining the trend over time indicating the presence or absence of a signal; and means functionally connected to said trend determining means for generating, as a result of the determination of said trend over time, a first signal indicative of signal strength increasing with time, a second signal indicative of signal strength decreasing with time, and a third signal indicative of signal strength above a selected threshold.

9. A scanning radio receiver comprising:

a first circuit for developing an output representative of the noise power contained in a demodulated signal at a present time;

a second circuit for delaying the output of said first circuit thereby generating an output representative of the noise power contained in the demodulated signal at a past time;

a first comparison circuit for comparing the output of said second circuit with the output of said first circuit to develop an output indicating decreasing noise power and therefore improving signal quality;

a second comparison circuit for comparing the output of said second circuit with the output of said first circuit so as to develop an output indicating increasing noise power and therefore degrading signal quality; and a third comparison circuit for comparing the output of said first circuit with a reference level to develop an output indicating noise power above/below a threshold and therefore signal strength below/above a corresponding threshold;

10. The scanning radio receiver of claim 9, and further comprising:

local oscillator generating means; and control processing means responsive to output of said first, second and third comparison circuits so as to control said local oscillator generating means.

11. The scanning radio receiver of claim 9, and further comprising:

local oscillator generating means; and control processing means responsive to the outputs of said first and second comparison circuits so as to control said local oscillator generating means.

12. The scanning radio receiver of claim 9 wherein said circuits are incorporated in an integrated circuit.

13. The scanning radio receiver of claim 9, wherein said circuits are incorporated in a microprocessor.

* * * * *